United States Patent
Elmieh et al.

(10) Patent No.: US 10,842,034 B2
(45) Date of Patent: Nov. 17, 2020

(54) MODULAR ELECTROMECHANICAL DEVICE

(71) Applicant: Facebook, Inc., Menlo Park, CA (US)

(72) Inventors: Baback Elmieh, Palo Alto, CA (US); Alexandre Jais, San Francisco, CA (US); Rex Wenters Crossen, Oakland, CA (US); Andrew Alexander Robberts, Novato, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/170,763

(22) Filed: Oct. 25, 2018

(65) Prior Publication Data
US 2019/0069424 A1    Feb. 28, 2019

Related U.S. Application Data

(62) Division of application No. 15/408,304, filed on Jan. 17, 2017, now Pat. No. 10,154,601.
(Continued)

(51) Int. Cl.
*H05K 5/02* (2006.01)
*G06F 1/18* (2006.01)
(Continued)

(52) U.S. Cl.
CPC .......... *H05K 5/0256* (2013.01); *G06F 1/169* (2013.01); *G06F 1/1613* (2013.01);
(Continued)

(58) Field of Classification Search
None
See application file for complete search history.

(56) References Cited

U.S. PATENT DOCUMENTS

| | | | |
|---|---|---|---|
| 6,359,777 B1 * | 3/2002 | Newman | G06F 1/163 206/320 |
| 6,505,258 B1 | 1/2003 | Sakarda et al. | |

(Continued)

FOREIGN PATENT DOCUMENTS

| | | |
|---|---|---|
| CN | 203276086 U | 11/2013 |
| CN | 104030233 A | 9/2014 |

(Continued)

OTHER PUBLICATIONS

European Patent Office, Search Report and Opinion, European Patent Application No. 17152379.8, dated May 24, 2017, ten pages.
(Continued)

*Primary Examiner* — Daniel P Wicklund
*Assistant Examiner* — Douglas R Burtner
(74) *Attorney, Agent, or Firm* — Fenwick & West LLP

(57) ABSTRACT

Various embodiments of a modular electromechanical device are described herein. The modular electromechanical device includes a chassis and a plurality of functional modules that can be connected to the chassis. Each module is associated with a different functionality. The functionality of the modular electromechanical device is defined based on various attributes including the functionality of the different functional modules that are connected to the electromechanical device, the sequence in which the different functional modules are connected to the electromechanical device, the specific attachment structures used to attach the functional modules to the electromechanical device, or a pattern of traces formed within the chassis.

17 Claims, 10 Drawing Sheets

Related U.S. Application Data

(60) Provisional application No. 62/281,158, filed on Jan. 20, 2016.

(51) Int. Cl.
*G06F 1/16* (2006.01)
*H05K 7/02* (2006.01)
*H05K 5/00* (2006.01)

(52) U.S. Cl.
CPC .......... *G06F 1/1684* (2013.01); *G06F 1/1688* (2013.01); *G06F 1/182* (2013.01); *G06F 1/183* (2013.01); *H05K 5/0021* (2013.01); *H05K 5/0204* (2013.01); *H05K 7/023* (2013.01)

(56) References Cited

U.S. PATENT DOCUMENTS

| | | | |
|---|---|---|---|
| 9,807,891 B2* | 10/2017 | Tsukahara | G02F 1/133308 |
| 10,136,223 B1* | 11/2018 | Chen | H04R 5/04 |
| 2004/0214476 A1* | 10/2004 | Haas | H05K 5/0021 |
| | | | 439/701 |
| 2005/0076088 A1* | 4/2005 | Kee | G06F 1/169 |
| | | | 709/206 |
| 2010/0257285 A1 | 10/2010 | Lemke et al. | |
| 2011/0099298 A1* | 4/2011 | Chadbourne | G06F 11/3051 |
| | | | 710/10 |
| 2014/0121881 A1* | 5/2014 | Diazdelcastillo | G05D 1/0265 |
| | | | 701/23 |
| 2015/0319292 A1* | 11/2015 | Chan | H04M 1/0266 |
| | | | 455/575.1 |
| 2015/0331463 A1 | 11/2015 | Obie et al. | |
| 2015/0351704 A1* | 12/2015 | Kiani | A61B 5/02438 |
| | | | 361/679.29 |
| 2016/0150658 A1* | 5/2016 | Tsukahara | G02F 1/133308 |
| | | | 361/679.01 |
| 2017/0293507 A1* | 10/2017 | Liu | G06F 1/1626 |
| 2018/0025268 A1* | 1/2018 | Teig | G06N 3/063 |
| | | | 706/25 |
| 2018/0181218 A1* | 6/2018 | Lin | G06F 3/03545 |
| 2018/0248568 A1* | 8/2018 | Chaplet | H04B 1/3816 |
| 2019/0029132 A1* | 1/2019 | Haba | H05K 5/0065 |

FOREIGN PATENT DOCUMENTS

| | | |
|---|---|---|
| CN | 204217252 U | 3/2015 |
| JP | 2005-159399 A | 6/2005 |
| WO | WO 2001/40916 A1 | 6/2001 |
| WO | WO 2015/022615 A2 | 2/2015 |

OTHER PUBLICATIONS

PCT International Search Report and Opinion, PCT Application No. PCT/US2017/013952, dated May 2, 2017, thirteen pages.
United States Office Action, U.S. Appl. No. 15/408,304, dated Mar. 20, 2018, 13 pages.
State Intellectual Property Office of the People's Republic of China, First Office Action and Search Report, Chinese Patent Application No. 2017800074115, dated Mar. 11, 2019, ten pages.

\* cited by examiner

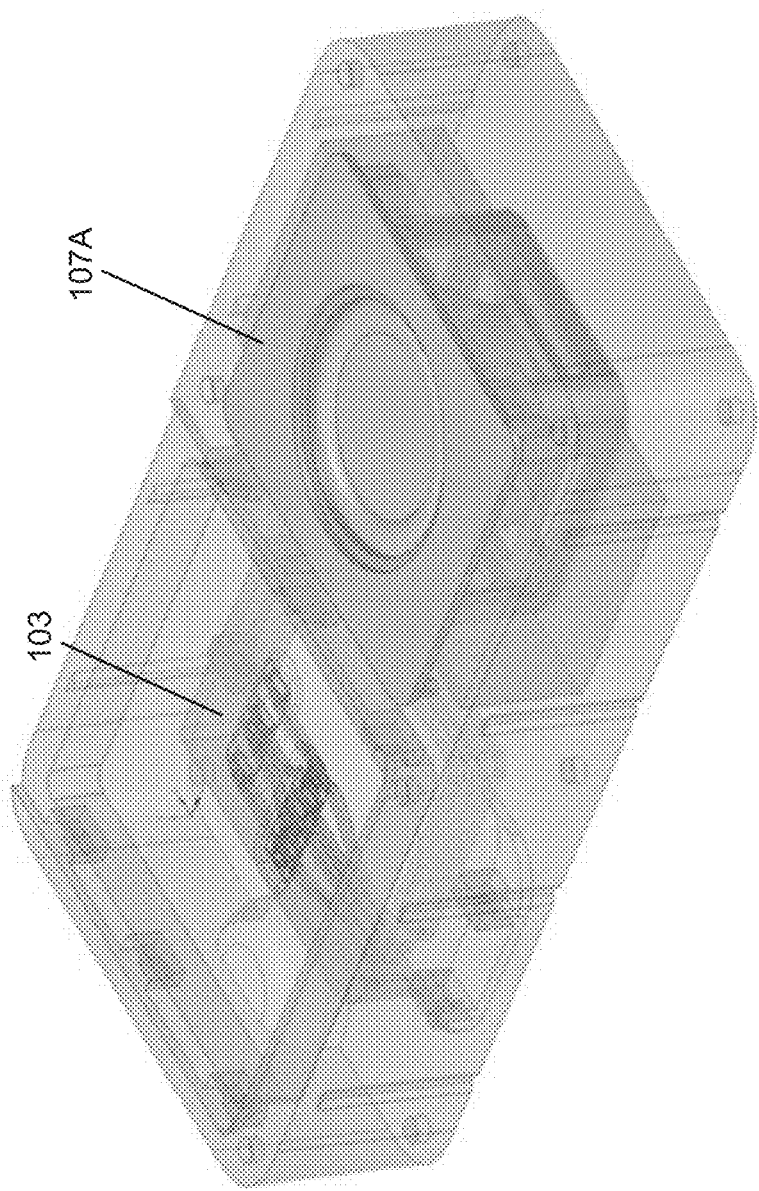

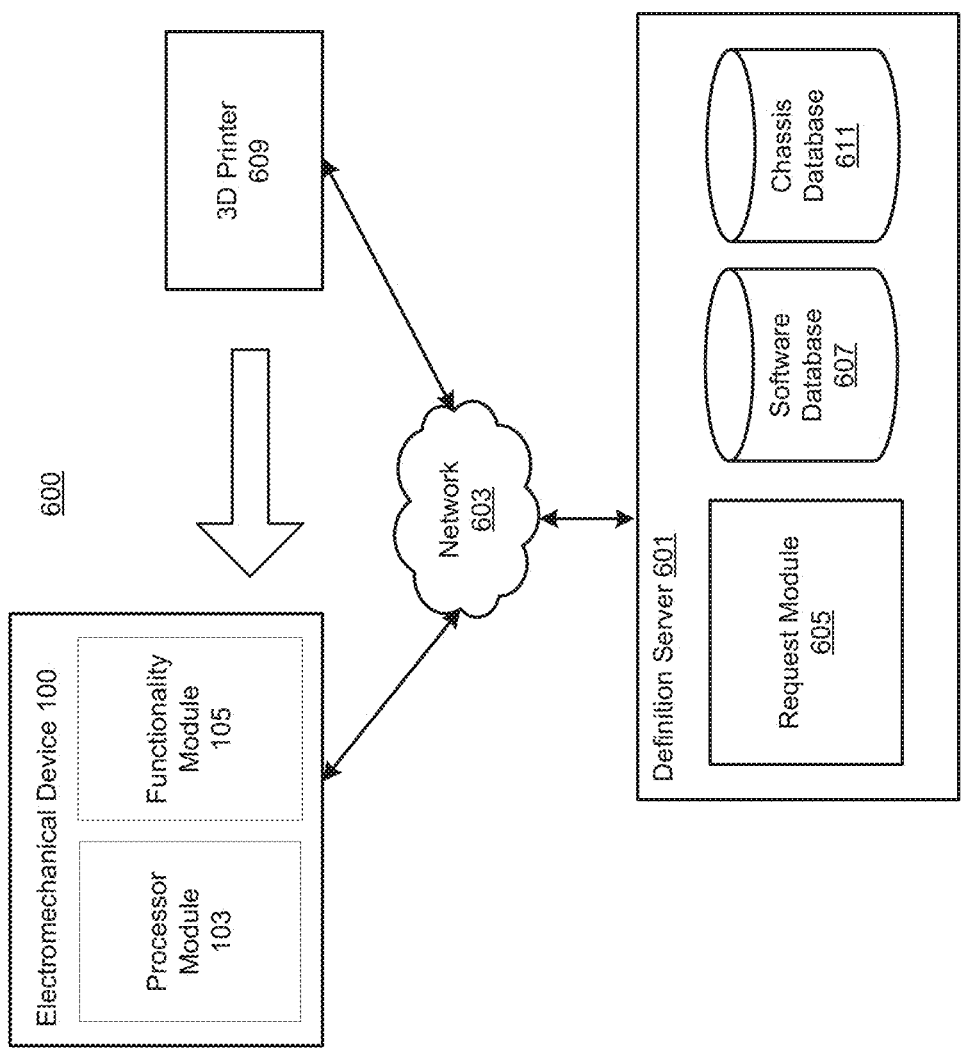

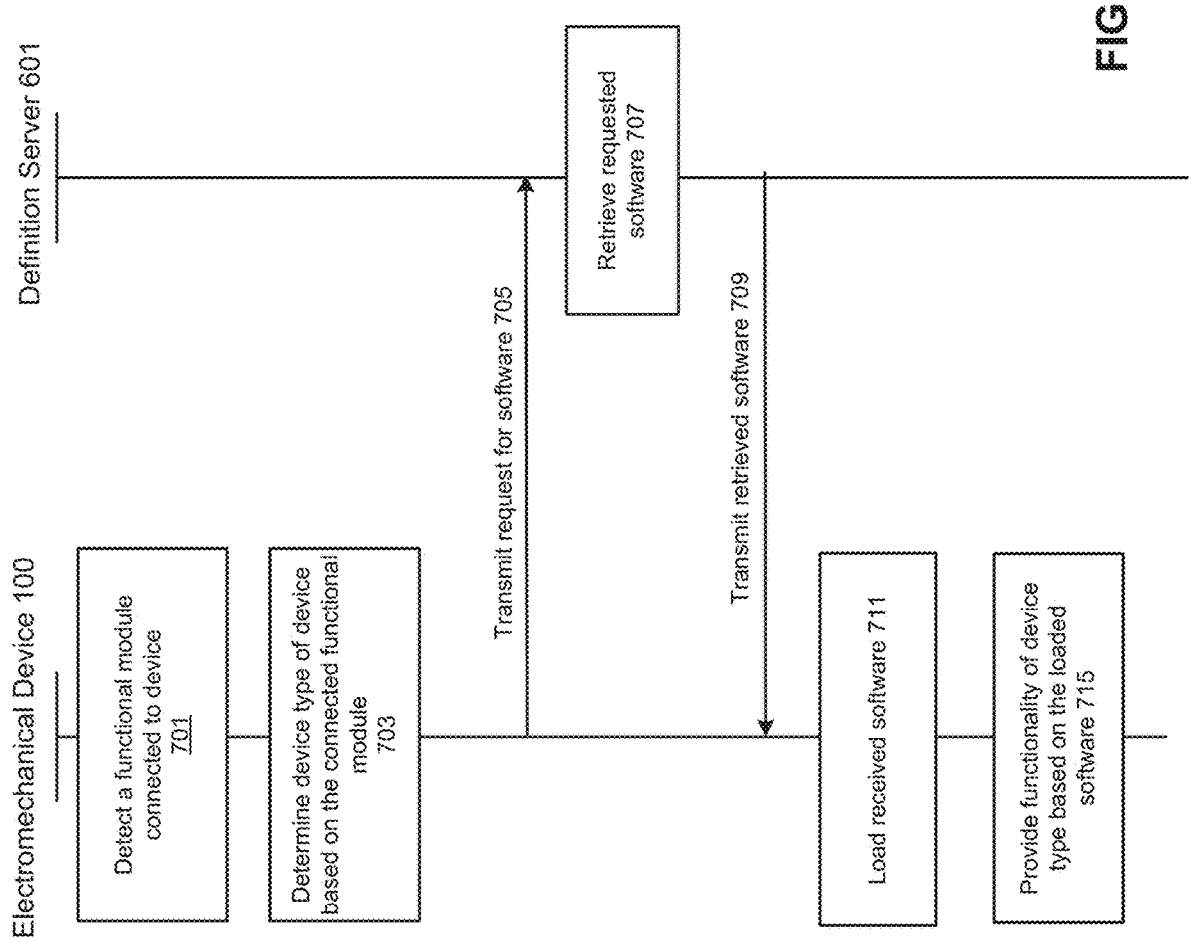

MODULAR ELECTROMECHANICAL DEVICE

CROSS-REFERENCE TO RELATED APPLICATIONS

This patent application is a divisional of U.S. patent application Ser. No. 15/408,304 filed on Jan. 17, 2017 which claims priority to and the benefit of U.S. Provisional Patent Application No. 62/281,158 filed on Jan. 20, 2016, each of which is incorporated by reference in its entirety.

TECHNICAL FIELD

The embodiments described herein relate to modular electromechanical devices, more specifically to electromechanical devices having their functions defined by the combination of modules attached to a chassis.

BACKGROUND

Conventional consumer electronics have a short life cycle. Consumers purchase consumer electronics that utilize cutting edge technology only to find that their electronics are outdated in the near future. The consumer electronics are then thrown away and replaced with the latest version of the electronics and the life cycle of the electronics repeats.

Typically, the hardware components included in the consumer electronics that are considered "outdated" are still useable. However, the hardware components can no longer be re-used since consumer electronics are designed as closed systems. From a consumer prospective, the life cycle of conventional consumer electronics is expensive and wasteful.

SUMMARY

The embodiments herein describe a modular electromechanical device. The modular electromechanical device includes a chassis and a plurality of functional modules that can be connected to the chassis. Each module is associated with a different functionality. The functionality of the modular electromechanical device is defined based on the functionality of the different functional modules that are connected to the electromechanical device. Thus, a user can change the functionality of the modular electromechanical device based upon which functional modules the user chooses to connect to the chassis.

In one embodiment an electromechanical device comprises: a processor module comprising: a processor circuit, a memory circuit connected to the processor circuit, and an interfacing circuit connected to the processor circuit. The electromechanical device also comprises a chassis including: a first attachment structure configured to attach the processor module to the chassis, one or more second attachment structures, each of the one or more second attachment structures configured to attach one of a plurality of functional modules to the chassis, each of the plurality of functional modules associated with a discrete functionality, and a plurality of traces extending between the first attachment structure and the one or more second attachment structures to operatively connect the interfacing circuit of the processor module with one or more functional modules attached to the one or more second attachment structures, wherein a function to be performed by the electromechanical device defined by at least one or more functional modules attached to the one or more second attachment structures.

In one embodiment, the chassis is a unitary structure formed from a three-dimensional (3D) printing process to include the first attachment structure, the one or more second attachment structures, and the plurality of traces.

In one embodiment, the first attachment structure is a first cavity extending into a body of the chassis and having at least a subset of the plurality of traces exposed from a wall defining the first cavity, and each of the one or more second attachment structures is a second cavity having at least a subset of the plurality of traces extending into the body of the chassis and having at least a subset of the plurality of traces exposed from a wall defining the second cavity.

In one embodiment, at least a subset of second cavities have a same size and shape.

In one embodiment, at least two of the one or more second attachment structures are sized and shaped differently to attach one group of functional modules but not another group of functional modules.

In one embodiment, each of the one or more second attachment structures includes an alignment structure to secure a corresponding functional module.

In one embodiment, the plurality of functional modules comprise at least one of a speaker functional module, a microphone functional module, a touch pad functional module, a global positioning system (GPS) functional module, a display screen functional module, or a thermometer functional module.

In one embodiment, the processor module is configured to determine the function to be performed by the electromechanical device by identifying functions performed by the functional modules attached to the chassis.

In one embodiment, the processor module is configured to determine the function to be performed by the electromechanical device based further on an impedance of an interfacing connection of a functional module attached to the chassis.

In one embodiment, the processor module further determines the function to be performed by the electromechanical device based on a sequence in which the one or more functional modules are attached to the chassis.

In one embodiment, the processor module further determines the function to be performed by the electromechanical device based on which of the one or more second attachment structures are used to attach the one or more functional modules.

In one embodiment, the electromechanical device performs a first function responsive to attaching a functional module to one of the second attachment structures, and the electromechanical device performs a second function responsive to attaching the same functional module to another of the second attachment structures.

In one embodiment, the processor module further determines the function to be performed by the electromechanical device based on a pattern formed by the plurality of traces in the chassis.

In one embodiment, the processor module determines that a first function is to be performed by the electromechanical device responsive to a set of functional modules connected through the plurality of trace wires of a first pattern, and wherein the processor module determines that a second function is to be performed by the electromechanical device responsive to the same set of functional modules connected through the plurality of trace wires of a second pattern.

In one embodiment, the processor module is further configured to determine a user of the electromechanical device based on the pattern formed by the plurality of trace wires in the chassis.

In one embodiment, the processor module comprises a plurality of configurable actuators each of which are configured to be set to an off state or an on state, and wherein the processor module determines the function to be performed by the electromechanical device based further on the off state or the on state of each of the plurality of configurable actuators.

In one embodiment, the processor module determines that the electromechanical device is to perform a first function responsive to attaching a set of functional modules to the chassis and setting a state of the plurality of configurable actuators to a first pattern, and wherein the processor module determines that the electromechanical device is to perform a second function when the same set of functional modules are housed within the chassis and setting the state of the plurality of configurable actuators to a second pattern.

In one embodiment, the processor module is configured to: transmit, over a network, a request for software to a server responsive to detecting the one or more functional modules attached to the chassis; receive the requested software from the server responsive to transmitting the request; load the received software; and operate the electromechanical device according to the loaded software.

In one embodiment, the requested software corresponds to the function to be performed by the electromechanical device as determined by the processor module based on the one or more functions attached to the chassis.

In one embodiment, a method is provided for configuring an electromechanical device. The method comprises: attaching a processor module to a first attachment structure of a chassis, the processor module comprising a processor circuit, a memory circuit connected to the processor circuit, and an interfacing circuit connected to the processor circuit; attaching each of one or more functional modules to each of one or more second attachment structures of the chassis, each of the one or more of functional modules associated with a discrete functionality; and operatively connecting the interfacing circuit of the processor module with the one or more functional modules attached to the one or more second attachment structures by a plurality of traces electrically extending between the first attachment structure and the one or more second attachment structures, a function to be performed by the electromechanical device defined by at least the one or more functional modules attached to the one or more second attachment structures.

BRIEF DESCRIPTION OF THE DRAWINGS

FIGS. 4A, 4B, and 4C illustrate examples modules of the modular electromechanical device, according to one embodiment.

FIG. 6 illustrates a block diagram of an environment for defining the modular electromechanical device, according to one embodiment FIG. 7 illustrates a method of the electromechanical device for obtaining software for operating the device, according to one embodiment.

The figures depict, and the detail description describes, various non-limiting embodiments for purposes of illustration only.

DETAILED DESCRIPTION

Various embodiments of a modular electromechanical device are described herein. The modular electromechanical device includes a chassis and a plurality of functional modules that can be connected to the chassis. Each module is associated with a different functionality. The functionality of the modular electromechanical device is defined based on various attributes. The attributes include the functionality of the different functional modules that are connected to the electromechanical device, the sequence in which the different functional modules are connected to the electromechanical device, the specific attachment structures used to attach the functional modules to the electromechanical device, or a pattern of traces formed within the chassis.

A "function" or "functionality" of a functional module, as described herein, is of a finer granularity that is generally perceived by a user as being insufficient function or functionality to constitute a stand-alone device. That is, a single functional module is generally not perceived by a user as providing sufficient function in itself to constitute a stand-alone device.

A "function" or "functionality" of the electromechanical device, as described herein, refers to function of a larger granularity that is generally perceived by a user as sufficient to constitute a stand-along device. The "function" or "functionality" of the electromechanical device is of larger granularity than the "function" of a functional module. For example, a function of a speaker functional module (a functional module) would be to generate sound when an electrical signal is received whereas a function of an Internet radio device (an electromechanical device that includes the speaker functional module) is to reproduce music received over Internet.

Structure of the Modular Electromechanical Device

Figure 1:
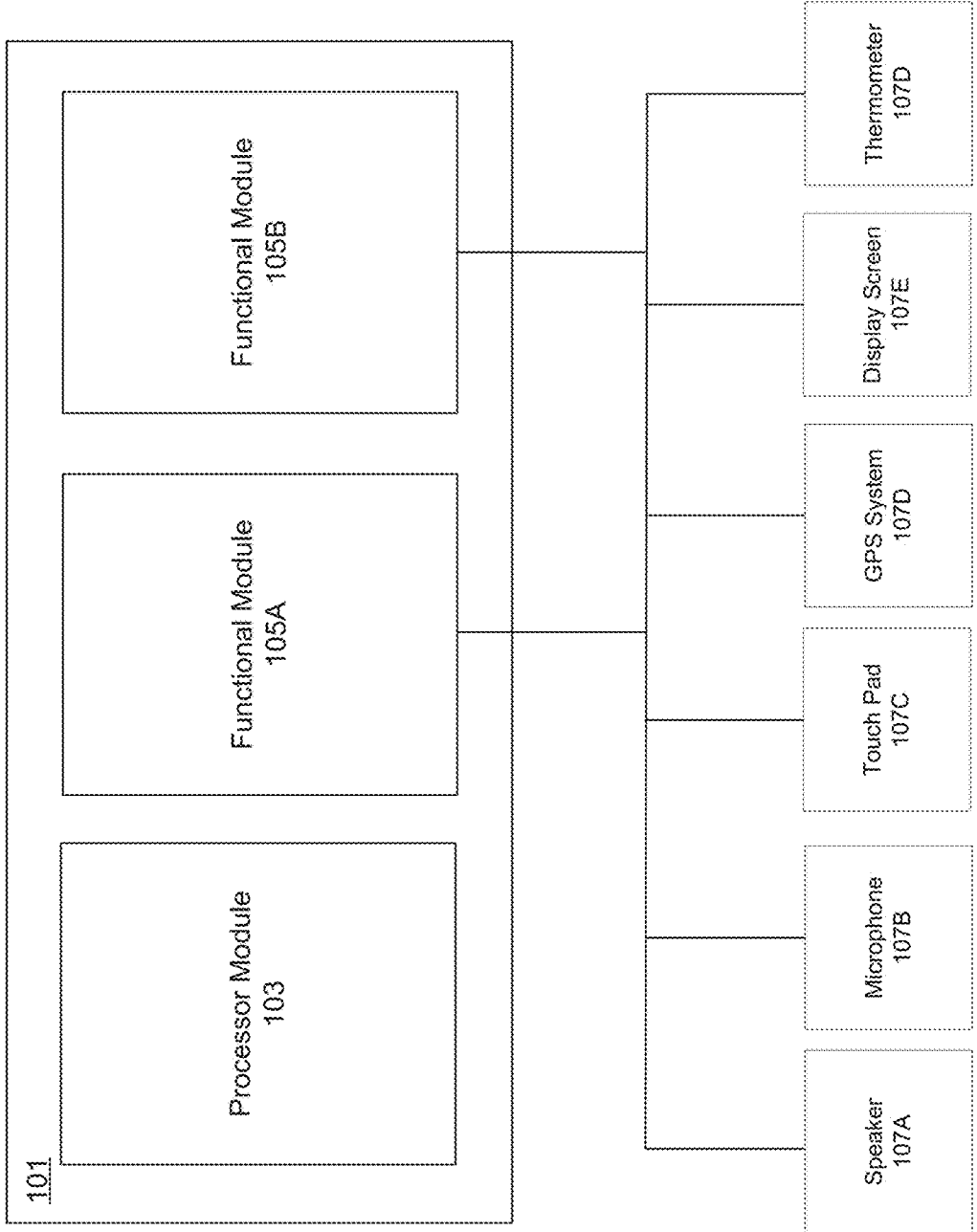
FIG. 1 illustrates an overview of a modular electromechanical device according to one embodiment.

FIG. 1 and the other figures use like reference numerals to identify like elements. A letter after a reference numeral, such as "102A," indicates that the text refers specifically to the element having that particular reference numeral. A reference numeral in the text without a following letter, such as "102," refers to any or all of the elements in the figures bearing that reference numeral.

FIG. 1 illustrates an overview of a modular electromechanical device 100 (hereinafter referred to as a "device") according to one embodiment. The device 100 can be configured into a plurality of different types of devices that each have a distinct functionality based upon the modules that are connected to the device 100. For example, the device 100 can be initially configured as a speaker device and then later reconfigured into a global positioning system (GPS) device. Thus, the device can provide a user with a multitude of different functionality based upon the modules connected to the device 100.

In one embodiment, the device 100 includes a chassis 101 that is configured to connect to a plurality of different modules 103, 105 as shown in FIG. 1. The chassis 101 functions as a structure that electrically connects together the different modules 103, 105 that are attached to the chassis 101.

Figure 2:
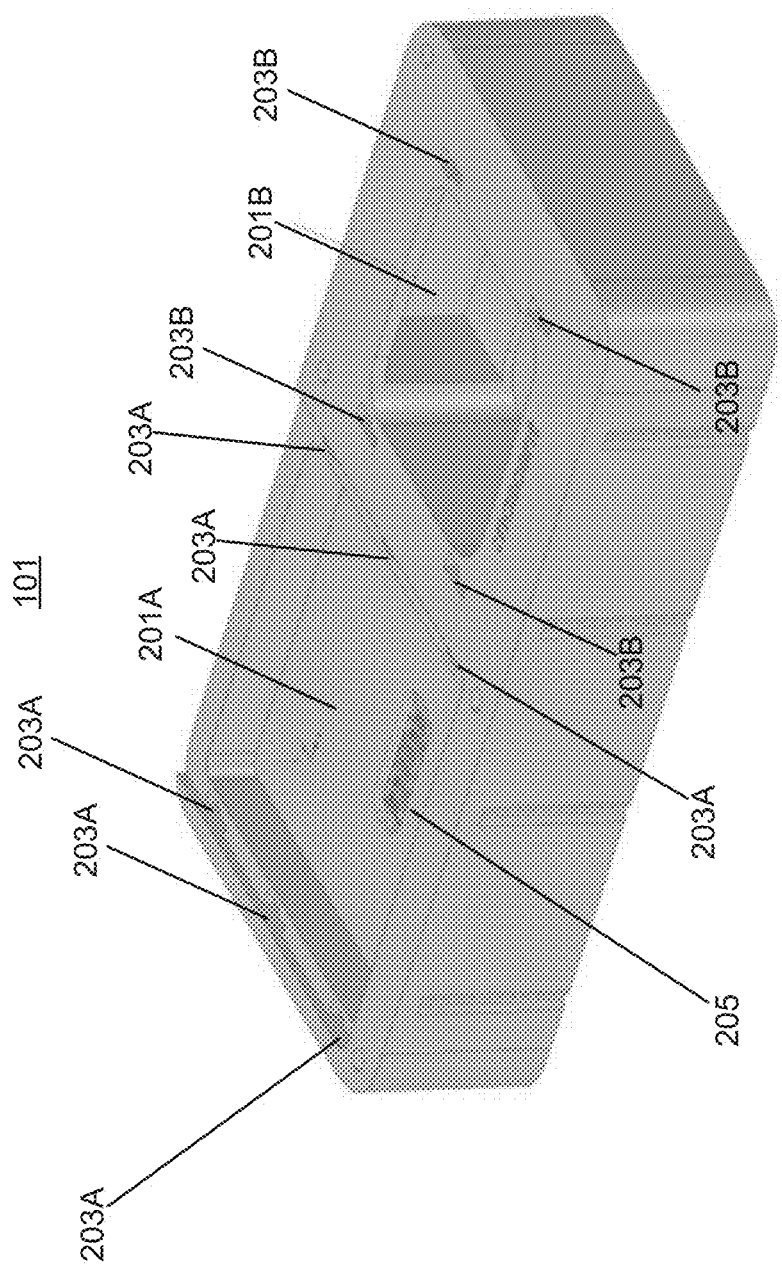
FIG. 2 illustrates an isometric view of a chassis of the modular electromechanical device according to one embodiment.

FIG. 2 illustrates one embodiment of a chassis 101. As shown in FIG. 2, the chassis 101 is rectangular in shape. However, the chassis 101 can be formed into any shape such as a square shape, a triangle shape, an oblong shape, or any other shape.

Generally, the chassis 101 includes a plurality of attachment structures. Each attachment structure is configured to attach a single module 103, 105 to the chassis 101. In one embodiment, the plurality of attachment structures are cavities formed within the chassis as shown in FIG. 2. FIG. 2 illustrates one embodiment of a chassis 101 that includes a first cavity 201A and a second cavity 201B. While only two cavities are shown in FIG. 2, the chassis 101 can have any number of cavities formed within the chassis.

Generally, each cavity is a hollow space formed within the chassis and the shape and size of the cavity is defined by a plurality of walls that define the cavity. In other words, each cavity extends into a body of the chassis 101. Other properties of the cavity may include connection to particular traces that function as sensors or components within the cavity. Cavities are typically formed only partially through a thickness of the chassis 101. However, a cavity can also be formed through the entire thickness of the chassis 101. In one embodiment, the shape and size of the different cavities formed within the chassis 101 are the same. When the shape and size of the cavities are the same, any module 103, 105 can be inserted into any cavity formed within the chassis 101. Thus, all of the modules 103, 105 have the same shape and size so that any module 103, 105 can fit into any of the cavities formed within the chassis 101. The cavities can be square shaped, circular shaped, triangular shaped, or any other shape.

Alternatively, the shape and/or size of the cavities formed within the chassis 101 are different. For example, in FIG. 2 cavity 201A is larger than cavity 201B although cavity 201A and cavity 20B are both square shaped. When the cavities included in the chassis 101 have a different shape and/or size, each cavity may only be configured to house particular modules that have a shape and size that match the shape and size of that particular cavity. The shape and size of the cavity can also enhance the functionality of the module 103, 105 connected to the chassis 101. For example, a cavity may include a speaker resonance chamber to enhance the functionality of a speaker module that is connected to the chassis. Other functional characteristics of the cavity can act to enhance the properties of the cavity than those described herein.

In one embodiment, the chassis 101 is also formed to include a plurality of alignment structures that align each module 103, 105 for connection to the chassis 101. That is, each cavity includes a plurality of structures for aligning a module 103, 105 for connection to the cavity associated with the plurality of alignment structures. In particular, the plurality of alignment structures for a corresponding cavity align a module into the cavity such that an electrical connector of the module can be inserted into an electrical connector located within the cavity. Details of the electrical connector are described below. An example of an alignment feature is a slot formed within the chassis 101.

The alignment structures for each cavity may be formed around the cavity at a predetermined spacing. For example, the alignment structures can be formed at corners of a square cavity. The alignment structures may also be formed only partway through a thickness of the chassis 101. For example, FIG. 2 illustrates that cavity 201A includes alignment structures 203A for aligning a module 103, 105 to connect the module's electrical connector to an electrical connector located within the cavity 201A. Similarly, cavity 201B includes alignment structures 203B for aligning a module 103, 105 to connect to connect the module's electrical connector to an electrical connector located within the cavity 201B.

In one embodiment, the chassis 101 is also formed to include a plurality of traces. The traces formed within the chassis 101 communicatively connect together modules 103, 105 that are connected to the chassis 101 in one embodiment. The traces may route power and/or signals to the different modules 103, 105 that are connected to the chassis 101. In another embodiment, the traces can also function as a sensor or actuator structure.

In one embodiment a trace is a conductive structure such as a wire. The trace can be made of conductive material such as metal (e.g., copper or gold) or non-metallic materials (e.g., silicone, epoxy resign, or an organic conductive material). In one embodiment, a trace is made of a non-conductive material. For example, a trace may be made of a translucent resin that is injected into the chassis 101. The translucent resin may solidify and creates a wave guide for light that allows information to be transmitted through light pulses like an optical fiber. A trace may also be formed of a piezo electric material.

Figure 3:
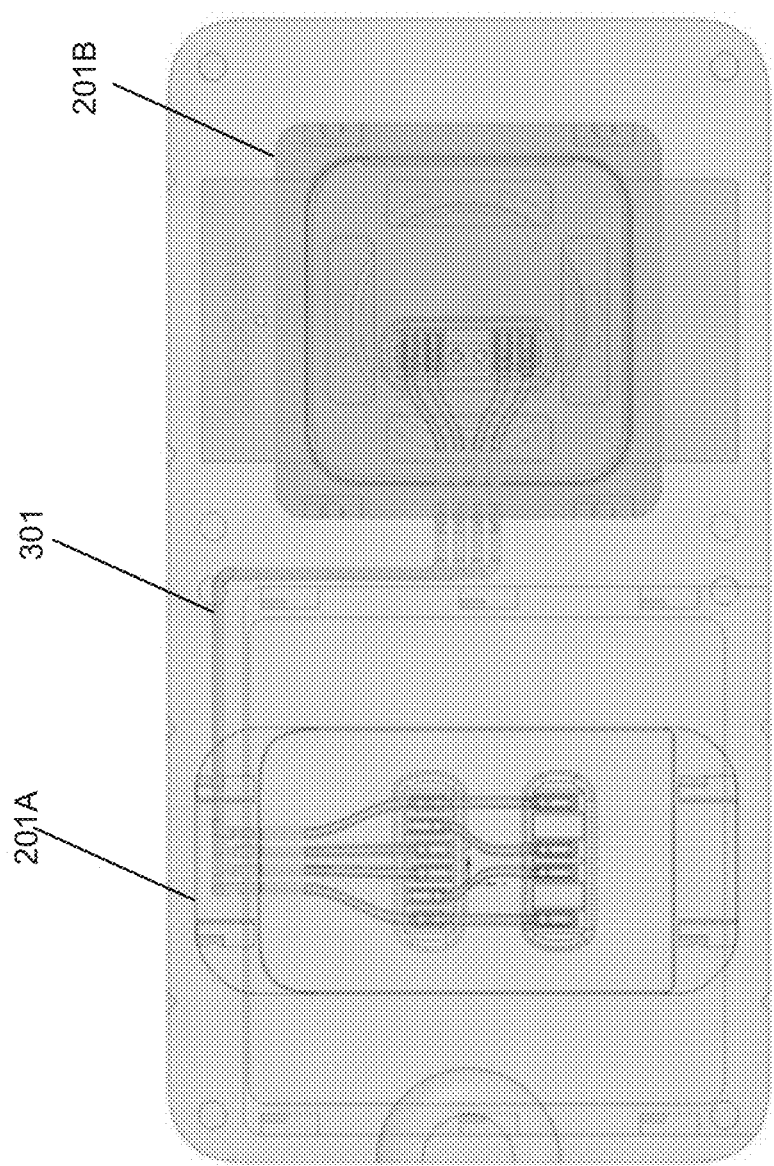
FIG. 3 illustrates traces formed within the chassis, according to one embodiment.

FIG. 3 illustrates a plan view of the chassis shown in FIG. 2 that depicts the traces 301 formed in the chassis. The trace may also include pads, interconnects, or any other structure needed for electrically connecting together different modules.

In one embodiment, the traces can be formed within the chassis 101 in different patterns. A pattern of the traces describes the layout of the traces within the chassis 101. The chassis 101 can be formed to include a plurality of different patterns of traces where each unique pattern of trace is associated with a specific device type. As will be further described below, the functionality of the device 100 can be based upon the pattern of the traces formed within the chassis 101.

The traces included in the chassis 101 terminate into electrical connectors (e.g., interfacing connections) that are formed into the chassis 101. Each electrical connector is formed within the chassis and is located on a wall of a corresponding one of the attachment structures formed within the chassis 101. That is, each attachment structure includes an associated electrical connector. The electrical connector may be a male or female type connector. An electrical connector formed within the chassis 101 is connected to a corresponding electrical connector included in a module 103, 105 when the module 103, 105 is connected to one of the attachment structures of the chassis 101. Thus, the electrical connectors included in the modules 103, 105 and the electrical connectors formed in the chassis 101 are used to electrically connect the modules to the chassis 101. Referring to FIG. 2, cavity 201A includes connector 205. An electrical connector included in a module 103, 105 is plugged into the connector 205 of the cavity in order to electrically connect the module 103, 105 to the chassis 101. Although not shown in FIG. 2, cavity 201B also includes an electrical connector formed within the cavity 201B.

In one embodiment, the chassis 101 is formed of a unitary structure. The chassis 101 can be made of any material such as a polymer, a ceramic, an organic material, a composite material, or metal. The chassis 101 is formed through a three-dimensional (3D) printing process, in one embodiment. The 3D printing process includes additive and subtractive processes to integrate the various structural features of the chassis 101 and traces described above into the chassis

101. An example of a manufacturing process that can be used to create the chassis 101 with traces using a 3D printing process is described in U.S. patent application Ser. No. 14/921,868, filed on Oct. 23, 2015 which is incorporated by reference in its entirety.

Referring back to FIG. 1, a plurality of modules 103, 105 can be connected to the chassis 101. In one embodiment, a module is a discrete physical component that can be connected to the chassis 101. The modules are classified as either a functional module 105 or a processor module 103. The structure of the processor module 103 is described below in detail with reference to FIG. 4D. Typically, a device 100 includes a single processor module 103 and at least one functional module 105 connected to the device 100. However, any number of processor modules 103 and functional modules 105 can be connected to the chassis 101 depending on the design of the chassis 101. For example, in FIG. 1, the device 100 illustrates two functional modules 105A, 105B and a single processor module 103 connected to the chassis 101.

In one embodiment, a functional module 105 performs a function. That is, each functional module 105 is associated with a corresponding functionality. In one embodiment, each functional module 105 is associated with a single functionality. Generally, the functionality of the device 100 is defined based on the functionality of the functional module(s) 105 that is connected to the chassis 101.

Figure 4A:
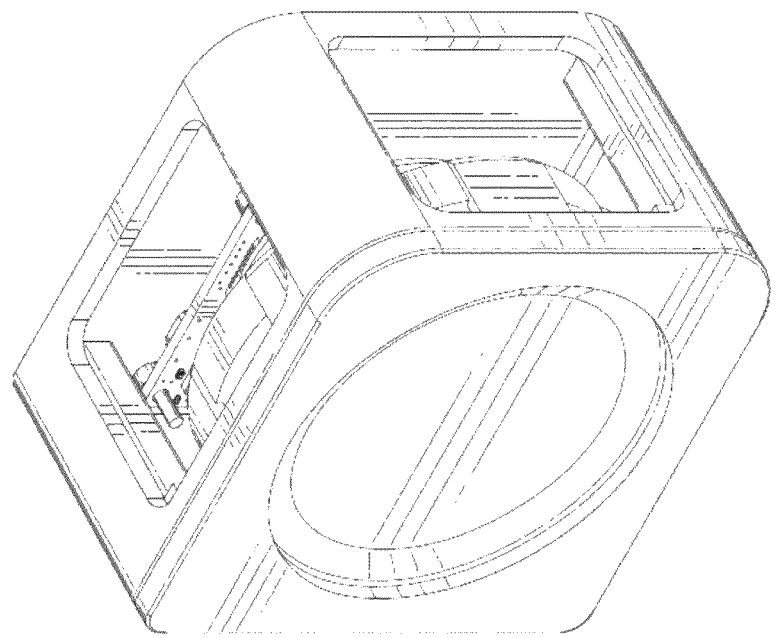

A functional module 105 may be associated with any type of functionality that describes the individual capability of the functional module 105. For example, a functional module 105 can be a speaker functional module 107A that outputs sound. FIG. 4A is one embodiment of a speaker functional module 107A. The speaker functional module 107A includes at least coils, magnets, and a speaker cone that are housed within frame. The various components included in the speaker functional module 107A allow the speaker to output sound.

Referring back to FIG. 1, a functional module 105 may be a microphone 107B for converting sounds into an electrical signal, a touch pad 107C for sensing touch of the device 100, a GPS system 107D that provides geo-location information, a display screen 107E for displaying images, or a thermometer 107D for providing temperature information. Other types of functional modules 105 may be incorporated into the device 100 other than those described above.

Figure 4B:
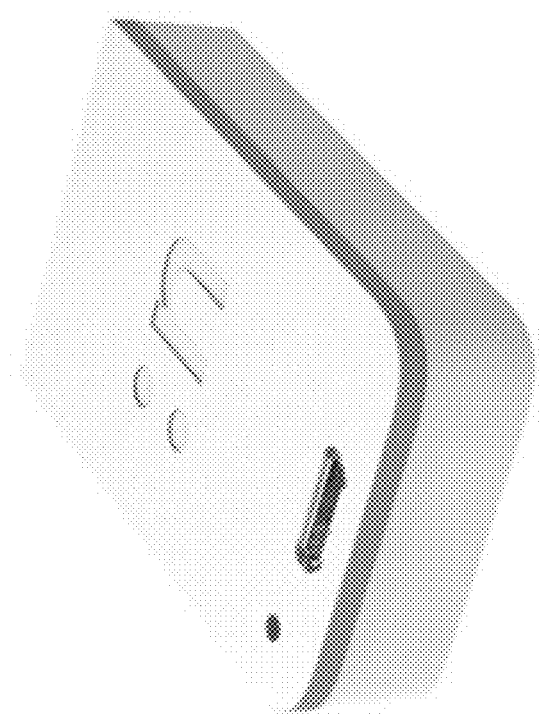

A processor module 103 functions as the central processing unit for the device 100. In one embodiment, the processor module 103 determines the functionality of the device 100 based at least in part on the functional module(s) 105 that are connected to the chassis 101. That is, the processor module 103 determines the device type of the device 100 based upon the functional module(s) 105 that are connected to the chassis 101 and the device type determines the function performed by the device 100. FIG. 4B illustrates one example of a processor module 103.

FIG. 4C illustrates a basic embodiment of the device 100 that includes a single processor module 103 and a single functional module connected to the chassis 101. In the example shown in FIG. 4C, a speaker functional module 107A and the processor module 103 are connected to the chassis 101. In one example, the device 100 has the functionality of a speaker based on speaker functional module 107 being connected to the chassis 101. However, the functionality of the device 100 can be based criteria other than merely the functionality of the functional module(s) 105 that are connected to the chassis 101.

Figure 4D:
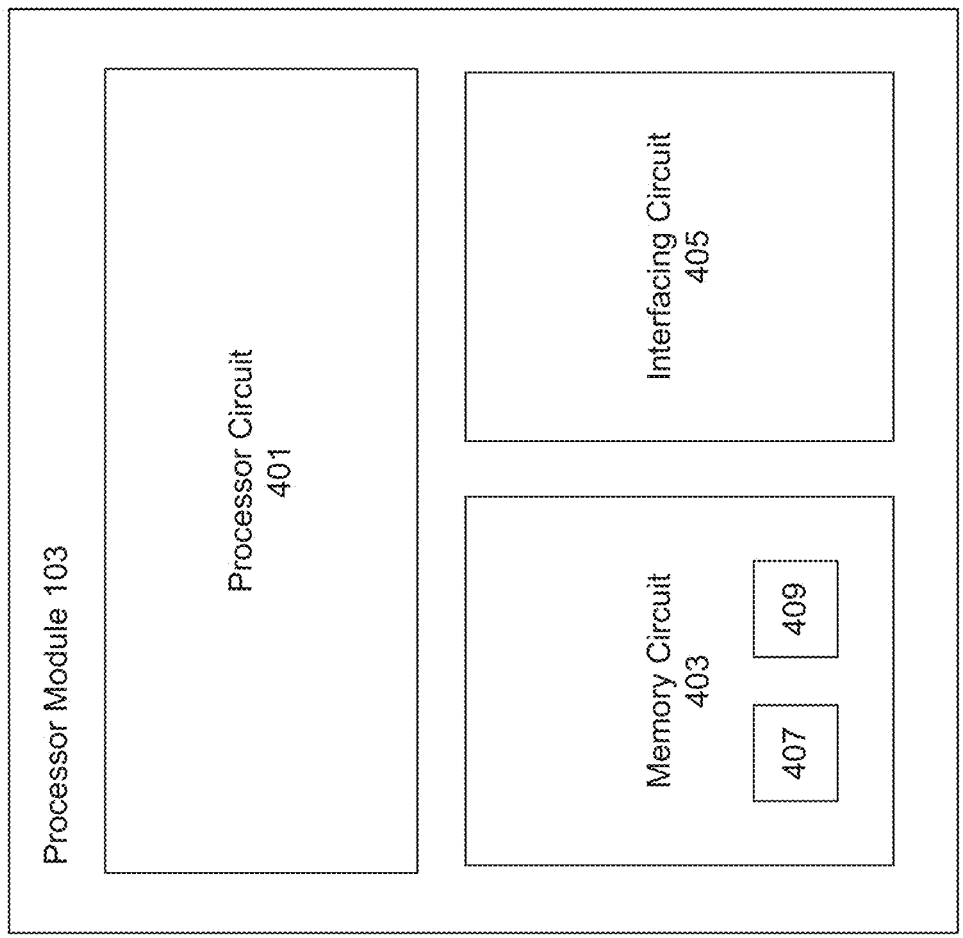
FIG. 4D is a block diagram illustrating a processor module, according to one embodiment.

FIG. 4D is a block diagram illustrating a detailed view of the processor module 103 according to one embodiment. As shown in FIG. 4D, the processor module 103 includes a processor circuit 401, a memory circuit 403, and an interfacing circuit 405. While only three circuits are included in the processor module 103 as shown in FIG. 4D, any number of circuits may be included in the processor module 103.

In one embodiment, the processor circuit 401 can be a single computer processor or may be architectures employing multiple computer processor designs for increased computing capability. In particular, the processor circuit 401 may be a general-purpose or embedded processor using any of a variety of instruction set architectures (ISAs), such as the x86, PowerPC, SPARC, RISC, ARM or MIPS ISAs, or any other suitable ISA.

In one embodiment, the memory circuit 404 stores instructions for execution by the processor module 103. For example, the memory circuit 404 stores the various rules for determining the device type of the device 100 as will be described below. The memory circuit 404 may be embodied as any type of memory including, for example, dynamic random access memory (DRAM), synchronous DRAM (SDRAM), double data rate (DDR, DDR2, DDR3, etc.) RAMBUS DRAM (RDRAM), static RAM (SRAM) or a combination thereof.

The memory circuit 403 may store, among other information, a rule set 407 and device information 409. The rule set 407 and the device information 409 collectively form software for determining the device type of the device 100 and for operating the device 100 according to its determined device type. Specifically, the rule set 407 defines the type and function of the device 100 based on, for example, (i) the sequence in which the functional modules are attached to the attachment structures, (ii) the combination of functional modules attached to the attachment structures, (iii) the impedance of one or more connectors of the functional modules, and (iv) the pattern of traces in the chassis. After the type and function of the device 100 are determined, the device information 409 for the determined device type is executed by the processor module 103 to coordinate operations between the functional modules 105 and the processor module 103.

In one embodiment, the interfacing circuit 405 is an interface that connects the processor module 103 to the traces included in the chassis 101. The interfacing circuit enables the processor module 103 to communicate with the functional modules 105 that are connected to the chassis 101.

Methods for Determining Device Type

As mentioned above, the processor module 103 determines the device type of the device 100 based on the functionality of the functional modules 105 that are connected to the chassis 101. When the device 100 is turned on, the processor module 103 detects which functional modules 105 are connected to the chassis 101. The processor module 103 may detect which functional modules 105 are connected to the chassis 101 by communicating with the functional modules 105 via the plurality of traces that electrically connect together the processor module 103 and the functional modules 105. The processor module 103 may receive an identifier from each functionality module 105 that is connected to the chassis 101. Each identifier may be indicative of the specific type of functional module 105 that is associated with the identifier. For example, the identifier may indicate that the functional module 105 is a speaker or a display screen.

In another embodiment, the processor module 103 determines the functional modules 105 connected to the chassis 101 based on an impedance (e.g., resistance) of each functional module 105 connected to the chassis 101. In particular, each type of functional module 105 has a unique impedance at the connector of the functional module 105. The unique impedance for each of the different types of functional modules 105 functions as an identifier for the functional module 105. In one embodiment, the processor module 103 detects the functional modules 105 that are connected to the chassis 101 by measuring the impedance at the connector of each functional module 105 that is connected to the chassis 101 using known techniques for measuring impedance of circuits.

In one embodiment, the type of device that the device 100 becomes is based upon a sequence (e.g., an order) that the functional modules 105 are connected to the chassis 101 in addition to the specific functional modules 105 connected to the chassis 101. The processor module 103 may store a plurality of sequence rules that describe the device type of the device based upon different sequences in which functional modules 105 are connected to the chassis 101. Each sequence rule describes a specific sequence for connecting a particular set of functional modules 105 to the chassis 101 and the specific device type associated with the sequence. As functional modules 105 are connected to the chassis 101, the processor module 103 logs the sequence that the functional modules 105 are connected to the chassis 101. After a threshold amount of time has elapsed since the last functional module 105 is connected to the chassis (e.g., 10 seconds), the processor module 103 compares the logged sequence to the sequence rules. The processor module 103 identifies a sequence rule that matches the logged sequence and determines the device type of the device 100 based on the device type associated with the identified sequence rule.

For example, consider the scenario where a speaker functional module 107A and a microphone functional module 107B will be plugged into chassis 101. The device type of device 100 is dependent on the sequence in which the speaker functional module 107A and the microphone functional module 107B are connected to the chassis 101. For example, if the speaker functional module 107A is first connected to the chassis 101 followed by the microphone functional module 107B, the processor module 103 may determine that the device 100 is a karaoke device based on the sequence rules. However, if the microphone functional module 107B is first connected to the chassis 101 followed by the speaker functional module 107A, the processor module 107B may determine that the device 100 is a telephone device based the sequence rules. Thus, the order in which functional modules 105 are connected to the chassis affects the device type of the device 100.

In one embodiment, the resulting device type of the device 100 is based upon the attachment structures in the chassis 101 that are used to connect functional modules 105 to the chassis. That is, device 100 can become a different type of device based upon which attachment structures are used to connect to the functional modules 105 to the chassis 101. In one embodiment, the processor module 103 stores a plurality of attachment structure rules that describe the type of device the device 100 will become based upon which attachment structures are used to connect the functional modules 105 to the chassis 101.

For example, consider the scenario where a speaker functional module 107A and a microphone functional module 107B will be plugged into the chassis 101 that includes attachment structure A and attachment structure B. The device type of device 100 will is dependent on which attachment structures are used to connect to the speaker functional module 107A and the microphone functionality module 107B. For example, if the speaker functional module 107A is connected to the chassis 101 using attachment structure A and the microphone functional module 107B is connected to the chassis 101 using attachment structure B, the processor module 103 may determine that the device 100 is a karaoke device based on the attachment structure rules. However, if the microphone functional module 107B is connected to the chassis 101 using attachment structure A and the speaker functional module 107A is connected to attachment structure B, the processor module 107B may determine that the device 100 is a telephone device based the attachment structure rules. Thus, although the same functional modules 105 are attached to the chassis 101, the device type of device 100 changes based on which attachment structures are used to connect to the functional modules.

In one embodiment, the processor module 103 determines the device type of a device 100 based on the specific combination of functional modules connected to the chassis 101. The processor module 103 may store a set of combination rules describing the resulting device type of the device 100 based upon different combinations of functional modules 105 connected to the chassis 101. After detecting the functional modules 105 that are connected to the chassis 101, the processor module 103 compares the detected combination of functional modules 105 connected to the chassis with the set of combination rules. The processor module 103 determines the device type of the device 100 based on the comparison.

For example, if the processor module 103 determines that a GPS system functional module 107D is connected to the chassis, the processor module 103 may determine that the device 100 is a hiking tracker that tracks a user's position along various hiking trails based on the set of combination rules. In another embodiment, if the processor module 103 determines that a speaker functional module 107A and microphone functional module 107A are connected to the chassis 101, the processor module 103 determines that the device 100 is a telephone device based on the combination rules. Thus, the combination of different functional modules affects the device type of device 100.

In one embodiment, the processor module 103 determines the device type of a device 100 according to a pattern of the traces formed within the chassis 101 of the device 100. As mentioned above, the chassis 101 can be formed to include a plurality of different patterns of traces where each unique pattern of trace is associated with a specific device type. The device type of a device 100 is based upon the pattern of traces formed in the chassis 101 and the specific functionality modules 105 connected to the chassis 101. That is, if the same functional modules 105 are connected to two different chassis that incorporate different patterns of traces, the device types associated with the different chassis are different since the chassis have different patterns of traces.

Figure 5:
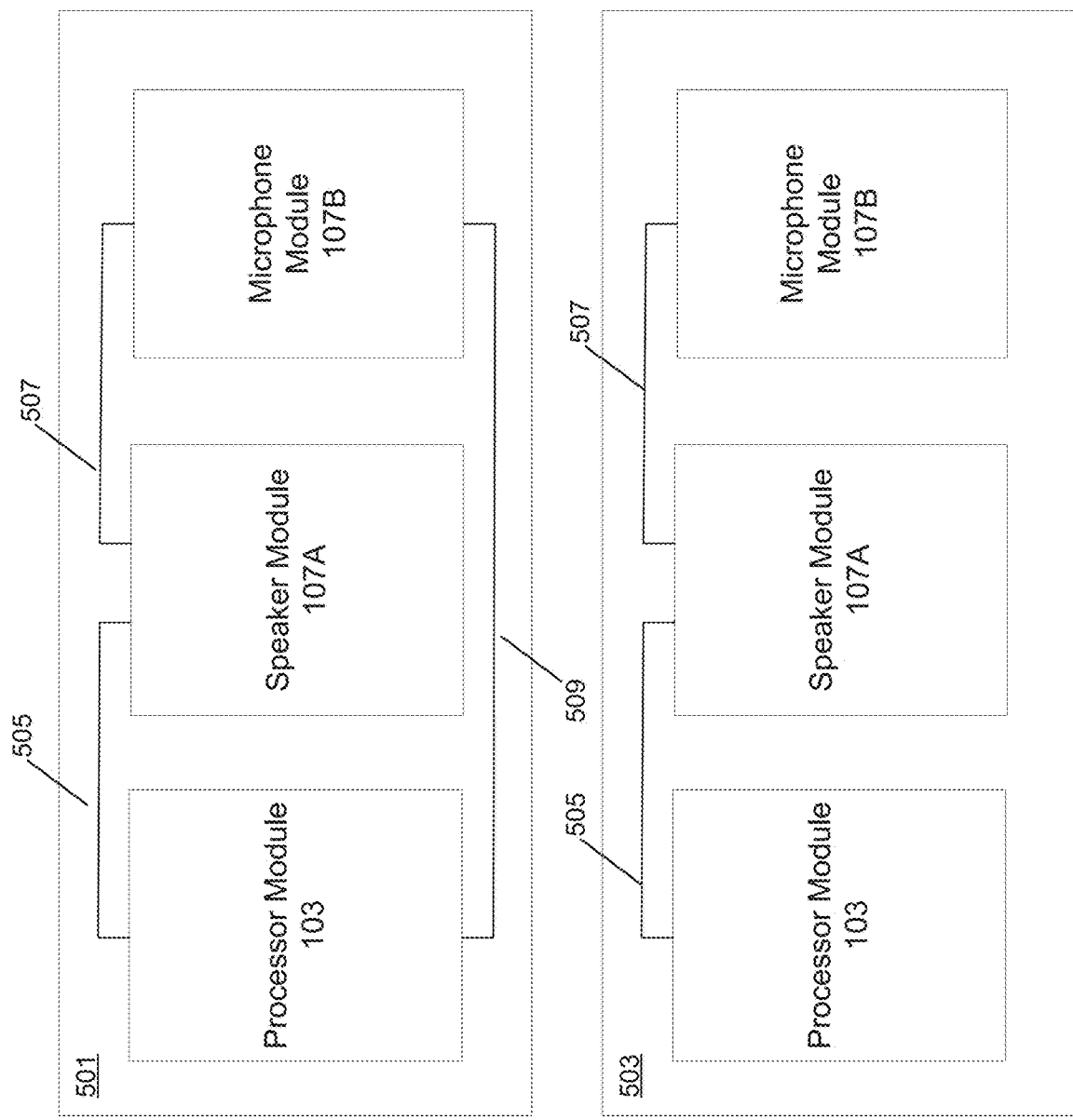
FIG. 5 illustrates different chassis including distinct patterns of traces formed within the chassis, according to one embodiment.

For example, FIG. 5 illustrates two chassis that have different patterns of traces according to one embodiment. As shown in FIG. 5, chassis 501 and chassis 503 both have a processor module 103, a speaker functional module 107A, and a microphone functional module 107B connected to the attachment structures of chassis 501 and chassis 503. However, chassis 501 and chassis 503 have different patterns of traces formed within the chassis.

For example, the pattern of traces included in chassis 501 comprises a first trace 505 that connects the processor module 103 to the speaker functional module 107A. The pattern of traces included in chassis 501 also includes a second trace 507 that connects together the speaker functional module 107A and the microphone module 107B. Lastly, the pattern of traces included in chassis 501 includes a third trace 509 that connects together the processor module 103 and the microphone functional module 107B. The pattern of traces included in chassis 503 also includes the first trace 505 and the second trace 507 as described above with respect to chassis 501. However, the pattern of traces included in chassis 503 lacks the third trace. Thus, chassis 501 and chassis 503 have a different pattern of traces.

In this example, the processor module 103 determines that the device including chassis 501 is a karaoke device whereas the device including chassis 503 is a telephone device based on the different pattern of traces included in the different chassis. Although both chassis 501 and chassis 503 have the same functional modules 103 connected to the chassis, the processor module 103 determines different device types for the devices based on the pattern of traces formed within chassis 501 and chassis 503.

In one embodiment, each chassis may include a radio frequency identifier (RFID) tag that indicates an identifier of the pattern of traces formed within the chassis. The processor module 103 may receive the identifier of the pattern of traces formed within the chassis when the processor module 103 is connected to the chassis. The processor module 103 may access stored device type rules that are unique to different chassis that each have a unique pattern of traces. The device type rules describe the type of device that the device will become based upon the type of functionality module(s) 105 that are connected to the chassis. After determining the functional modules 105 that are connected to the chassis, the processor module 103 accesses the device type rules that are unique to the chassis to determine the device type of the device according to the functional modules 105 that are connected to the chassis.

In one embodiment, the pattern of traces that is formed within a chassis is also unique to a user associated with the chassis. Thus, the pattern of traces identifies a user that is associated with the chassis as well as define the type of device that a device will become based upon the type of functional module(s) 105 that are connected to the chassis as described above. In one embodiment, the RFID tag included in the chassis 101 may also provide an indication of the user that is associated with the chassis.

In yet another embodiment, the processor module 103 includes a plurality of configurable actuators that can be switched between different states such as an on state and an off state. The user can set the state of the configurable actuators to define the resulting device type of the device 100 after functional modules 105 are connected to the chassis 101. For example, the actuators included in the processor module 103 can be set to a first pattern so that the device becomes a karaoke device when a speaker functional module 107A and a microphone functional module 107B are connected to the chassis 101. Alternatively, the actuators included in processor module 103 can be set to a second pattern so that the device 100 becomes a telephone device when the speaker functional module 107A and the microphone functional module 107B are connected to the chassis 101.

In yet another embodiment, the processor module 103 determines the device type of the device 100 based on the geometry of the chassis 101 itself. For example, a first device and a second device may have the same type of functional module(s) (e.g., a speaker module) connected to the first device and the second device. However, the first device and second device may have chassis with different geometries.

The processor module 103 may determine different device types for the first device and the second device based on the chassis geometries of the first device and the second device. For example, the first device may have a rectangular shaped chassis whereas the second device may have a circular shaped chassis. The processor module 103 may determine that the first device with the rectangular shaped chassis is a telephone device based on the square shape of the chassis and the second device with the circular shaped chassis is a karaoke device based on the circular shaped chassis.

Once the processor module 103 has detected the functional modules 105 that are connected to the chassis 101 and determined the device type of the device 100, the processor module 103 loads software for operating the functional modules 105 according to the determined device type. The software allows the device 100 to perform the function associated with the determined device type. In one embodiment, the processor module 103 includes the necessary software for operating the functional modules 105 according to the determined device type. In another embodiment, the processor module 103 fetches the software for operating the functional modules 105 from a definition server 100 as described below.

Operating Environment of the Device

FIG. 6 is a block diagram of an environment 600 for defining the device 100 according to one embodiment. Environment 600 includes device 100 that comprises a processor module 103 and at least one functional module 105. The device 100 is connected to a definition server 601 via a network 603. Generally, the definition server 601 stores definitions of the functionality of devices and the design of chassis as will be described below. Although environment 600 shown in FIG. 6 includes only a single device 100, the environment 600 can include any number of devices 100 (e.g., millions of devices 100).

Network 603 enables communication among the entities connected to it. In one embodiment, network 603 is the Internet and uses standard communications technologies and/or protocols. Thus, network 603 can include links using technologies such as Ethernet, 802.11 (WiFi), worldwide interoperability for microwave access (WiMAX), 3G, Long Term Evolution (LTE), digital subscriber line (DSL), asynchronous transfer mode (ATM), InfiniBand, etc. Similarly, the networking protocols used on network 603 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 603 can be represented using technologies and/or formats including the hypertext markup language (HTML), the extensible markup language (XML), etc. In addition, all or some of links can be encrypted using conventional encryption technologies such as the secure sockets layer (SSL), transport layer security (TLS), virtual private networks (VPNs), Internet Protocol security (IPsec), etc. In one embodiment, network 603 may include but is not limited to any combination of a local area network (LAN), a metropolitan area network (MAN), and a wide area network (WAN). In another embodiment, the entities use custom and/or dedicated data communications technologies instead of, or in addition to, the ones described above.

In one embodiment, the processor module 103 communicates with the definition server 601 to obtain the software required to operate the detected functional module(s) 105 that are connected to the chassis 101 of the device 100. After determining the device type of the device 100, the processor module 103 transmits a request to the definition server 601 for the software associated with the determined device type and the functional modules 105 connected to the chassis 101.

As shown in FIG. 6, the definition server 601 includes a request module 605 that processes requests for software. The request module 605 is computer program logic utilized to provide the specified functionality. Thus, the request module 605 can be implemented in hardware, firmware, and/or software. In one embodiment, request module 605 is stored on a non-transitory storage device (i.e., a computer program product), loaded into a memory, and executed by one or more computer processors included in the definition server 601. Additionally, those of skill in the art will recognize that other embodiments of the definition server 601 shown in FIG. 6 can have different and/or other modules than the ones described here, and that the functionalities can be distributed among the modules in a different manner.

In one embodiment, the request module 605 receives requests from the device 100 for the software required to operate the detected functional module(s) 105 that are connected to the chassis 101 of the device 100. The request received by the request module 605 includes the device type of the device 100 determined by the processor module 103 and the functional module(s) 105 that are connected to the chassis 101 of the device 100. The request module 605 processes the request by retrieving the software associated with the device type and the functional module(s) 105 specified in the request from a software database 607. In one embodiment, the software database 607 stores different software for operating a device according to all of the different types of devices that a device can be configured into based upon the functional modules 105 connected to the device 100.

After the request module 605 has retrieved the requested software, the request module 605 transmits the software to the device 100. The processor module 103 executes the software received from the definition server 601 in order for the user to operate the device 100 according to the determined device type.

FIG. 7 is an interaction diagram of a process for obtaining software for a device 100 according to one embodiment. The interaction diagram illustrates the steps performed by the device 100 and the definition system 601 according to one embodiment.

In one embodiment, the device 100 detects 701 one or more functional modules 105 connected to the chassis 101 of the device 100. For example, the device 100 may detect that a speaker functional module 107A and a microphone functional module 107B are connected to the chassis 101 of the device 100. The device 100 determines 703 the device type of the device 100 based on the connected functional module 105. The device 100 may also determine the device type of the device based on other factors described above such as the sequence in which different functional modules 105 are connected to the chassis 101 or the specific attachment structures used to connect the functionality modules to the chassis 101.

The device 100 transmits 705 a request for software to the definition server 601. The request includes the determined device type of the device 100 and the functional modules 105 detected by the device 100. The definition server 601 receives the request and retrieves 707 the requested software stored in the software database 607. The definition server 601 transmits 709 the retrieved software 709 to the device 100. The device 100 loads 711 the received software and provides 715 the functionality of the determined device type based on the loaded software 715. For example, if the determined device type is a telephone device, the device 100 provides telephone related functionality to the user of the device.

Thus, the embodiments described herein describe a modular electromechanical device. The functionality of the modular electromechanical device can be changed by the user based on various factors such as the functionality of the different functional modules that are connected to the electromechanical device. Thus, a single device can be configured in a multitude of different types of devices based upon the functional modules that are connected to the device. Furthermore, the life cycle of the electromechanical device is extended as the user can purchase new functional modules to replace outdated functional modules since the electromechanical device is an open system that allows the user to reuse the chassis 101 of the device.

Referring back to FIG. 6, in one embodiment a 3D printer 609 is connected to the definition server 601 via the network 603. The 3D printer generates the chassis of the device 100 using a 3D printing process as described above. In one embodiment, the definition server 601 includes a chassis database 611. The chassis database 611 includes various chassis definition files. Each chassis definition file is associated with a unique chassis and describes structural features of the chassis. For example, a chassis definition file for a chassis defines the size and shape of the associated chassis as well as the size, shape, position, and number of the attachment structures included in the chassis. Also, each chassis definition file describes the pattern of the traces that are included in the associated chassis.

A user of the 3D printer 609 loads a chassis definition file retrieved from the chassis database 611 into the 3D printer 609. The 3D printer 609 then creates the chassis 101 of the device 100 using a 3D printing process.

Although this description has been provided in the context of specific embodiments, those of skill in the art will appreciate that many alternative embodiments may be inferred from the teaching provided. Furthermore, within this written description, the particular naming of the components, capitalization of terms, the attributes, data structures, or any other structural or programming aspect is not mandatory or significant unless otherwise noted, and the mechanisms that implement the described invention or its features may have different names, formats, or protocols.

Finally, it should be noted that the language used in the specification has been principally selected for readability and instructional purposes, and may not have been selected to delineate or circumscribe the inventive subject matter. Accordingly, the disclosure is intended to be illustrative, but not limiting, of the scope of the invention.

What is claimed is:

1. An electromechanical device comprising:
   a processor module comprising:
      a processor circuit,
      a memory circuit connected to the processor circuit, and
      an interfacing circuit connected to the processor circuit;
   a chassis including:
      a first attachment structure configured to attach the processor module to the chassis,
      a plurality of second attachment structures, each of the plurality of second attachment structures configured to attach to at least one of a first functional module associated with a first functionality or a second functional module associated with a second functionality that is different from the first functionality of the first functional module, and a plurality of traces extending between the first attachment structure and the plurality of second attachment structures to operatively connect the interfacing circuit of the processor module with at least one of the first functional module or the second function module, wherein the electromechanical device lacks a device type and is without functionality until the processor module is attached to the first attachment structure and at least one of the first functional module or the second functional module is attached to one of the plurality of second attachment structures;

wherein the processor module while attached to the first attachment structure determines that the electromechanical device is of a first device type that performs a first function, based on the first functionality of the first functional module responsive to the first functional module being attached to one of the plurality of second attachment structures and wherein the processor module determines that the electromechanical device is of a second device type that performs a second function that is different from the first function, based on the second functionality of the second functional module responsive to the second functional module being attached to one of the plurality of second attachment structures.

2. The electromechanical device of claim 1, wherein the chassis is a unitary structure formed from a three-dimensional (3D) printing process to include the first attachment structure, the one or more second attachment structures, and the plurality of traces.

3. The electromechanical device of claim 2, wherein the first attachment structure is a portion of a body of the chassis formed with a first cavity extending into the body of the chassis and having a first connector exposed from a wall defining the first cavity, and each of the one or more second attachment structures is a portion of the body formed with a second cavity having at least a subset of the plurality of traces extending into the body of the chassis and having a second connector exposed from a wall defining the second cavity.

4. The electromechanical device of claim 3, wherein at least a subset of second cavities have a same size and shape.

5. The electromechanical device of claim 1, wherein at least two of the one or more second attachment structures are sized and shaped differently to attach one group of functional modules but not another group of functional modules.

6. The electromechanical device of claim 1, wherein each of the one or more second attachment structures includes an alignment structure to secure a corresponding functional module.

7. The electromechanical device of claim 1, wherein the at least one of the first functional module or second functional module comprises one of a speaker functional module, a microphone functional module, a touch pad functional module, a global positioning system (GPS) functional module, a display screen functional module, or a thermometer functional module.

8. The electromechanical device of claim 1, wherein the electromechanical device performs a first function responsive to attaching the functional module to one of the second attachment structures, and the electromechanical device performs a second function responsive to attaching the same functional module to another of the second attachment structures.

9. The electromechanical device of claim 1, wherein the processor module is configured to determine that the electromechanical device is of the first device type that performs the first function based further on an impedance of a first interfacing connection of the first functional module responsive to the first functional module being attached to the chassis, and the processor module is configured to determine that the electromechanical device is of the second device type that performs the second function based further on an impedance of a second interfacing connection of the second functional module responsive to the second functional module being attached to the chassis.

10. The electromechanical device of claim 1, wherein the processor module is further configured to determine the first function or the second function to be performed by the electromechanical device based on a pattern formed by the plurality of traces in the chassis.

11. The electromechanical device of claim 10, wherein the processor module is configured to determine the first function is to be performed by the electromechanical device responsive to the first functional module connected through the plurality of trace wires of a first pattern, and wherein the processor module is configured to determine that the second function is to be performed by the electromechanical device responsive to the second functional module connected through the plurality of trace wires of a second pattern.

12. The electromechanical device of claim 10, wherein the processor module is further configured to determine a user of the electromechanical device based on the pattern formed by the plurality of trace wires in the chassis.

13. The electromechanical device of claim 1, wherein the processor module comprises a plurality of configurable actuators each of which are configured to be set to an off state or an on state, and wherein the processor module determines the first function or the second function to be performed by the electromechanical device based further on the off state or the on state of each of the plurality of configurable actuators.

14. The electromechanical device of claim 13, wherein the processor module is configured to determine that the electromechanical device is to perform the first function responsive to attaching the first functional module to the chassis and setting a state of the plurality of configurable actuators to a first pattern, and wherein the processor module is configured to determine that the electromechanical device is to perform the second function when the second functional module is attached to the chassis and setting the state of the plurality of configurable actuators to a second pattern.

15. The electromechanical device of claim 1, wherein the processor module is configured to:
  transmit, over a network, a request for software to a server responsive to detecting the first functional module or the second functional module is attached to the chassis;
  receive the requested software from the server responsive to transmitting the request;
  load the received software; and
  operate the electromechanical device according to the loaded software.

16. The electromechanical device of claim 15, wherein the requested software corresponds to the function to be performed by the electromechanical device as determined by the processor module.

17. The electromechanical device of claim 1, wherein the processor module is configured to:

determine the first function to be performed by the electromechanical device responsive to the first functional module being attached to a first attachment structure from the plurality of second attachment structures, and determine a third function to be performed by the electromechanical device that is distinct from the first function and the second function responsive to the first functional module being attached to a second attachment structure from the plurality of second attachment structures.

\* \* \* \* \*